United States Patent
Kitani et al.

(10) Patent No.: US 7,098,882 B2
(45) Date of Patent: Aug. 29, 2006

(54) BIDIRECTIONAL SHIFT REGISTER SHIFTING PULSE IN BOTH FORWARD AND BACKWARD DIRECTIONS

(75) Inventors: Masakatsu Kitani, Fukaya (JP); Tetsuo Morita, Kounosu (JP)

(73) Assignee: Toshiba Matsushita Display Technology Co., Ltd., Tokyp (JP)

( * ) Notice: Subject to any disclaimer, the term of this patent is extended or adjusted under 35 U.S.C. 154(b) by 462 days.

(21) Appl. No.: 10/720,159

(22) Filed: Nov. 25, 2003

(65) Prior Publication Data

US 2004/0104882 A1    Jun. 3, 2004

(30) Foreign Application Priority Data

Nov. 29, 2002    (JP) .............................. 2002-348831

(51) Int. Cl.
    *G09G 3/36*    (2006.01)
(52) U.S. Cl. ........................................ 345/92; 345/100
(58) Field of Classification Search ................. 345/98, 345/100; 326/38, 46; 327/382, 434
    See application file for complete search history.

(56) References Cited

U.S. PATENT DOCUMENTS

| 4,849,658 A | * | 7/1989 | Iwamura et al. ............ 326/110 |
| 6,759,888 B1 | * | 7/2004 | Wodnicki .................... 327/382 |
| 6,903,570 B1 | * | 6/2005 | Kawase et al. ............... 326/38 |

FOREIGN PATENT DOCUMENTS

| JP | 2002-313093 | 10/2002 |
| JP | 2004288697 A | * 10/2004 |

\* cited by examiner

*Primary Examiner*—Amare Mengistu
(74) *Attorney, Agent, or Firm*—Oblon, Spivak, McClelland, Maier & Neustadt, P.C.

(57) ABSTRACT

In forward direction pulse shift, by turning off a sixteenth transistor, a through-current is prevented from flowing between the fifth transistor and the seventh transistor. In backward direction pulse shift, by turning off the fifteenth transistor, a through-current is prevented from flowing between the fifth and sixth transistors. Thus, a potential variation in an output signal of a shift register between the forward direction pulse shift and the backward direction pulse shift is prevented.

12 Claims, 9 Drawing Sheets

BIDIRECTIONAL SHIFT REGISTER SHIFTING PULSE IN BOTH FORWARD AND BACKWARD DIRECTIONS

CROSS-REFERENCE TO RELATED APPLICATIONS

This application is based upon and claims the benefit of priority from Japanese Patent Application No. 2002-348831 filed on Nov. 29, 2002; the entire contents of which are incorporated herein by reference.

BACKGROUND OF THE INVENTION

1. Field of the Invention

The present invention relates to a bidirectional shift register capable of shifting a pulse in both forward and backward directions and to a drive circuit and a flat display device, both of which use the bidirectional shift register.

2. Description of the Related Art

In recent years, a flat display device typified by a liquid crystal display device has been used in various kinds of equipment because the device is thin, lightweight and low in power consumption. In order to realize further thinning, weight saving and reduction in cost, a technology of configuring a drive circuit by use of polysilicon thin-film transistors with higher electron mobility than conventional amorphous silicon thin-film transistors and forming this drive circuit on a glass array substrate has been recently established.

Generally, a liquid crystal display device includes an array substrate, a counter substrate disposed opposite thereto and a liquid crystal layer disposed in a gap between the both substrates. On the array substrate, a plurality of scan lines and a plurality of signal lines are disposed so as to intersect with each other. At respective intersections of these scan lines and signal lines, switching elements and pixel electrodes are disposed. Moreover, on the array substrate, a signal line drive circuit that drives the signal lines and a scan line drive circuit that drives the scan lines are disposed as drive circuits. The signal line drive circuit includes a horizontal shift register that outputs a pulse to each of the signal lines by shifting a phase of the pulse. The scan line drive circuit includes a vertical shift register that outputs a pulse to each of the scan lines by shifting a phase of the pulse. On the counter substrate, counter electrodes electrically corresponding to the pixel electrodes are disposed.

In general, for the horizontal shift register and the vertical shift register, a three-phase shift register having a plurality of series-connected shift registers with the same configuration is used. In this three-phase shift register, by use of three clock signals having different phases from each other, a shift register shifts a phase of a pulse before transmitting the pulse to other shift register in a subsequent stage.

However, in the case of transmitting the pulse in a backward direction, an output signal of each shift register cannot be obtained at a sufficient potential level with the same circuit configuration as that in the case of the forward direction. Moreover, there occurs a variation in the potential level of the output signal between the forward direction and the backward direction. Thus, variation was a factor deteriorating display quality.

It is an object of the present invention to provide a bidirectional shift register that prevents variation in the potential level of the output signal between the forward direction and the backward direction in terms of the direction of transmitting the pulse.

It is another object of the present invention to provide a drive circuit and a flat display device, both of which use the foregoing bidirectional shift register.

SUMMARY OF THE INVENTION

A bidirectional shift register of the first embodiment comprises an output circuit that includes a first transistor having a conductive path between a first clock terminal and an output terminal and a second transistor having a conductive path between a power supply electrode and the output terminal, an input circuit that includes a third transistor having a conductive path between a forward direction pulse input terminal and a control electrode of the first transistor, a fourth transistor having a conductive path between a backward direction pulse input terminal and the control electrode of the first transistor and a fifth transistor having a conductive path between the power supply electrode and a control electrode of the second transistor, a reset circuit that includes a sixth transistor having a conductive path between a second clock terminal and the control electrode of the second transistor, a seventh transistor having a conductive path between a third clock terminal and the control electrode of the second transistor and an eighth transistor having a conductive path between the power supply electrode and the control electrode of the first transistor, which makes the path between the sixth transistor, the control electrode of the second transistor and a control electrode of the eighth transistor conductive as well as making the path between the fifth transistor and the seventh transistor non-conductive in forward direction pulse shift and which makes the path between seventh transistor, the control electrode of the second transistor and the control electrode of the eighth transistor conductive as well as making the path between the fifth transistor and the sixth transistor non-conductive in backward direction pulse shift, and an inversion prevention circuit that prevents inversion of a voltage level in the control electrode of the second transistor when a voltage level of a clock signal inputted to the first clock terminal is inverted in a state where the first transistor is on and the second transistor is off.

According to this invention, in the forward direction pulse shift, the reset circuit makes the path between the sixth transistor, the control electrode of the second transistor and a control electrode of the eighth transistor conductive as well as making the path between the fifth transistor and the seventh transistor non-conductive. Thus through-current between the fifth transistor and the seventh transistor is prevented.

In the backward direction pulse shift, the reset circuit makes the path between seventh transistor, the control electrode of the second transistor and the control electrode of the eighth transistor conductive as well as making the path between the fifth transistor and the sixth transistor non-conductive. Thus through-current between the fifth transistor and the sixth transistor is prevented.

Moreover, by preventing the through-current, the potential of the control electrode of the second transistor is sufficiently increased and thus the eighth transistor and the second transistor reach a complete off state. The complete off state of the eighth transistor allows the first transistor to reach a complete on state. One of the first and second transistors is completely turned off and the both transistors are not simultaneously turned on. Thus, the potential level of the output signal can be stabilized, and it is possible to prevent variation in the potential level of the output signal between the forward direction pulse shift and the backward direction pulse shift.

A drive circuit of the second embodiment comprises a plurality of bidirectional shift registers which are connected to each other in such a manner that an output signal from an output terminal of each of the bidirectional shift registers is inputted to a backward direction pulse input terminal of the bidirectional shift register in a preceding stage as well as to a forward direction pulse input terminal of the bidirectional shift register in a subsequent stage. Each bidirectional shift registers is the same as in the first embodiment.

A flat display device of the third embodiment comprises a plurality of bidirectional shift registers in at least one of a scan line drive circuit and a signal line drive circuit; an array substrate including the scan line drive circuit, the signal line drive circuit, switching elements and pixel electrodes provided in the respective switching elements, the switching elements being provided at respective intersections of a plurality of scan lines from the scan line drive circuit and a plurality of signal lines from the signal line drive circuit; a counter substrate which is disposed opposite to the array substrate and has counter electrodes provided thereon, the counter electrodes electrically corresponding to the respective pixel electrodes; and a display layer held between the array substrate and the counter substrate. Each bidirectional shift registers is the same as in the first embodiment. The bidirectional shift registers are connected to each other in the same manner as in the second embodiment.

DESCRIPTION OF THE EMBODIMENT

Figure 1:
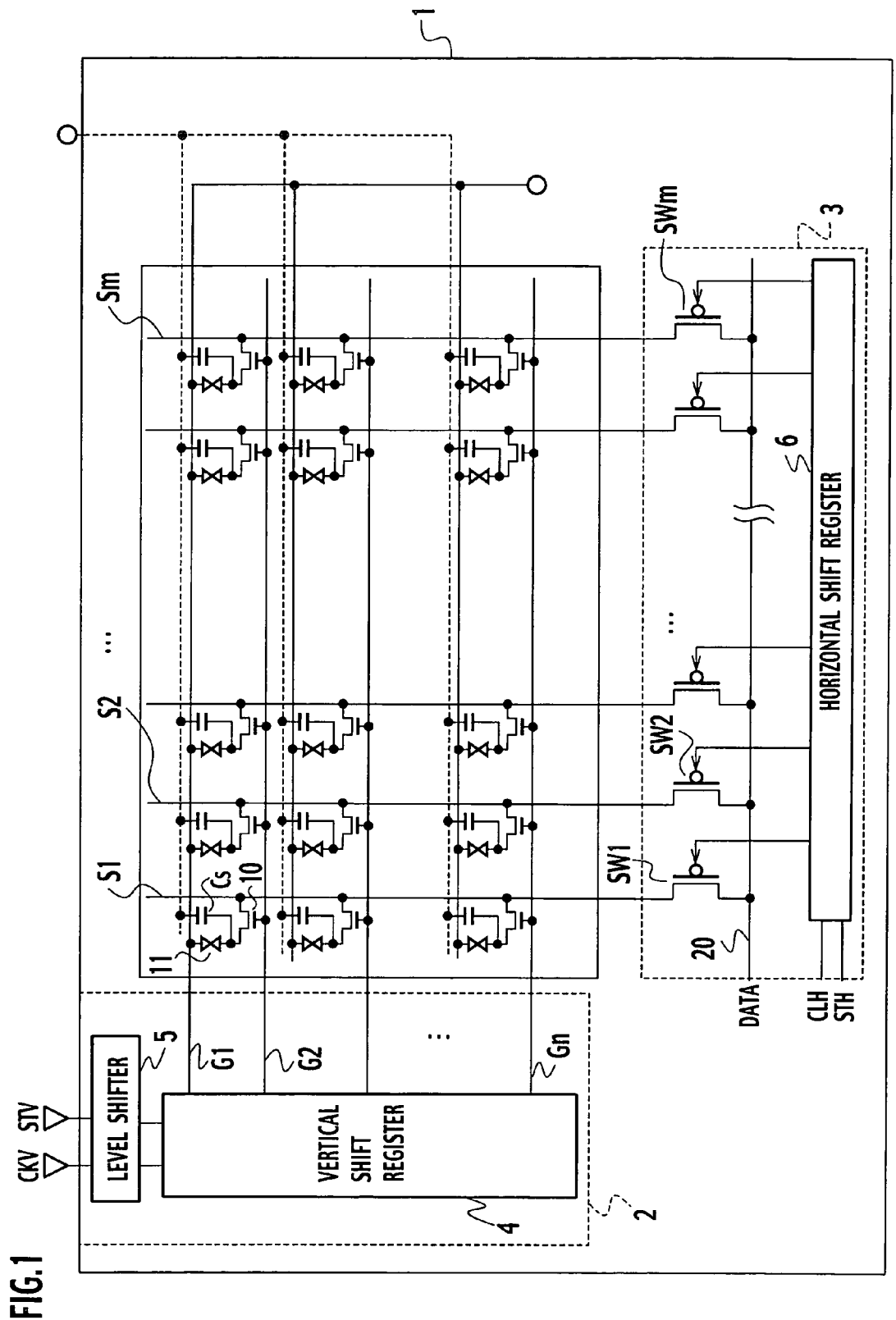
FIG. 1 shows a circuit diagram of a flat display device according to an embodiment of the present invention.

As shown in a circuit diagram of FIG. 1, in a flat display device according to an embodiment of the present invention, a plurality of scan lines G1, G2 . . . Gn (hereinafter collectively referred to as "G") from a scan line drive circuit 2 and a plurality of signal lines S1, S2 . . . Sm (hereinafter collectively referred to as "S") from a signal line drive circuit 3 are disposed on an array substrate 1 so as to intersect with each other and a switching element 10, a pixel electrode 11 and an auxiliary capacity Cs are disposed at each intersection of the scan line G and the signal line S. As the switching element 10, for example, a polysilicon thin-film transistor (P-SiTFT) is used. A control electrode of each switching element 10 is connected to the scan line G, a source thereof is connected to the pixel electrode 11 and the auxiliary capacity Cs and a drain thereof is connected to the signal line S. The scan line drive circuit 2 and the signal line drive circuit 3 are integrally formed on the array substrate 1 in the same manufacturing process as that of the switching element 10.

In order to realize cost reduction by shortening a manufacturing process, it is preferable to form all transistors used in the scan line drive circuit 2 and the signal line drive circuit 3 and all the switching elements 10 on the array substrate 1 by use of only PMOS transistors or NMOS transistors. In this embodiment, only the PMOS transistors are used.

The scan line drive circuit 2 includes a vertical shift register 4, a level shifter 5 and an unillustrated buffer circuit. The level shifter 5 amplifies a voltage of a vertical start pulse STV inputted from the outside. This vertical start pulse STV is a signal synchronized with a vertical clock signal CKV. The vertical shift register 4 outputs a vertical scan pulse by shifting a phase of the vertical start pulse STV for the respective scan lines G one by one. The buffer circuit amplifies voltage and current of the vertical scan pulse outputted from the vertical shift register 4 and outputs the vertical scan pulse to the scan line G.

The signal line drive circuit 3 includes: analog switches SW1, SW2 . . . SWm (hereinafter collectively referred to as "SW") connected to the respective signal lines S; a video signal bus 20 connected to the respective analog switches SW; a horizontal shift register 6 outputting a pulse, whose phase is shifted, to the respective analog switches SW; and an unillustrated level shifter. This level shifter amplifies a voltage of a horizontal start pulse STH inputted from the outside. The horizontal start pulse STH is a signal synchronized with a horizontal clock signal CLH. The horizontal shift register 6 outputs a horizontal scan pulse by shifting a phase of the horizontal start pulse STH for the respective signal lines S one by one. This horizontal scan pulse is inputted to the analog switch SW. The analog switch SW samples a video signal (DATA) supplied through the video signal bus 20 according to a timing of the horizontal scan pulse and outputs the video signal to the signal line S.

Figure 2:
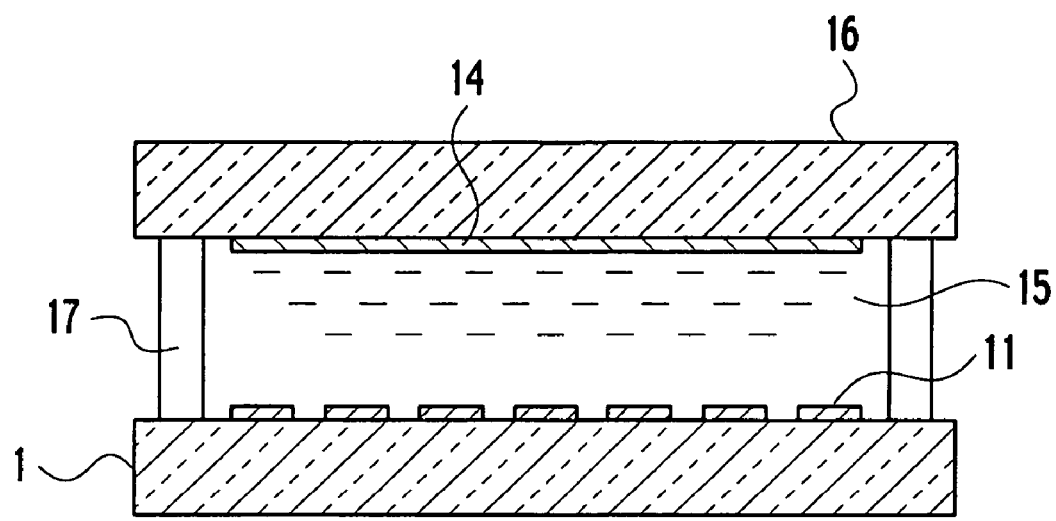
FIG. 2 shows a cross-sectional view of the flat display device of FIG. 1.

As shown in a cross-sectional view of FIG. 2, in this flat display device, a gap between the array substrate 1 and a counter substrate 16 disposed opposite thereto is sealed by a sealing member 17 and a liquid crystal layer 15 is held as a display layer between the both substrates. The pixel electrodes 11 are disposed on a surface of the array substrate 1 at a side contacting the liquid crystal layer 15 and counter electrodes 14 are disposed on a surface of the counter substrate 16 at a side contacting the liquid crystal layer 15.

Figure 3:
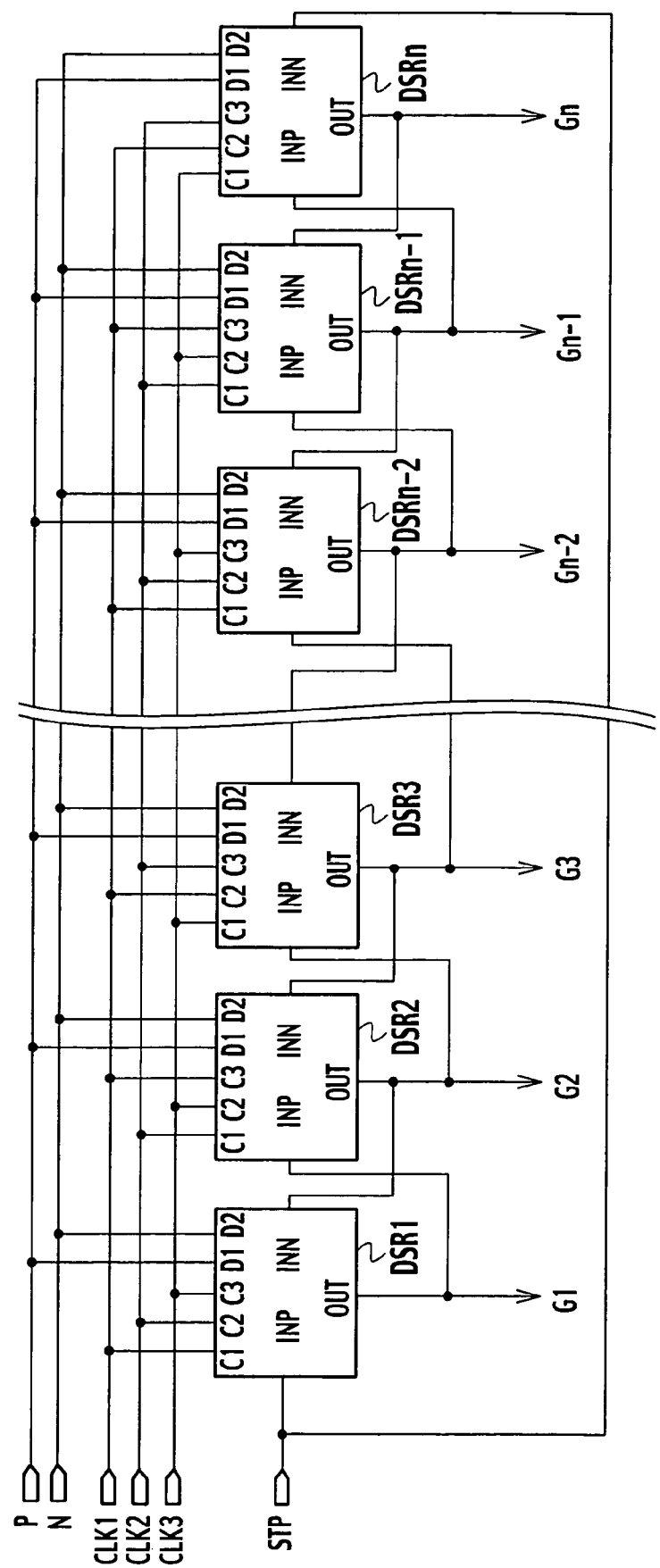
FIG. 3 shows a block diagram of a three-phase shift register in the flat display device of FIG. 1.

A three-phase shift register shown in FIG. 3 is used for at least one of the vertical shift register 4 of the scan line drive circuit 2 and the horizontal shift register 6 of the signal line drive circuit 3. A case where the three-phase shift register is used for the vertical shift register 4 will be described below as an example.

This three-phase shift register includes a plurality of bidirectional shift registers DSR1, DSR2 . . . DSRn (hereinafter collectively referred to as "DSR"). The bidirectional shift registers DSR1, DSR2 . . . DSRn correspond to a first stage, a second stage . . . an nth stage, respectively. Each bidirectional shift register DSR includes a first clock terminal C1, a second clock terminal C2, a third clock terminal C3, a forward direction pulse input terminal INP, a backward direction pulse input terminal INN, an output terminal OUT, a forward direction control terminal D1 and a backward direction control terminal D2.

The respective bidirectional shift registers DSR are connected to each other in such a manner that an output signal from the output terminal OUT thereof is inputted to the backward direction pulse input terminal INN of the bidirectional shift register in a preceding stage and to the forward direction pulse input terminal INP of the bidirectional shift register in a subsequent stage. To the first to third clock terminals C1 to C3 of each bidirectional shift register DSR, any one of three clock signals CLK1 to CLK3 having different phases from each other is inputted, respectively. A shift direction control signal P controlling a shift direction of a pulse is inputted to the forward direction control terminal D1, and a shift direction control signal N is inputted to the backward direction control terminal D2. The output terminals OUT of the respective bidirectional shift registers DSR are connected to the scan lines G. Switching between a forward direction pulse shift operation and a backward direction pulse shift operation is controlled by potentials of the shift direction control signals P and N.

In the forward direction pulse shift operation, a start pulse STP is transmitted toward the bidirectional shift register DSRn from DSR1. Specifically, the start pulse STP is inputted to the forward direction pulse input terminal INP of the bidirectional shift register DSR1 and, to each of the forward direction pulse input terminals INP of the bidirectional shift registers DSR in the second to nth stages, a signal outputted from the output terminal OUT of the bidirectional shift register in the preceding stage is sequentially inputted.

In the backward direction pulse shift operation, a start pulse STP is transmitted toward the bidirectional shift register DSR1 from DSRn. Specifically, the start pulse STP is inputted to the backward direction pulse input terminal INN of the bidirectional shift register DSRn and, to each of the backward direction pulse input terminals INN of the bidirectional shift registers DSR in the (n−1)th to first stages, a signal outputted from the output terminal OUT of the bidirectional shift register in the preceding stage is sequentially inputted.

Figure 4:
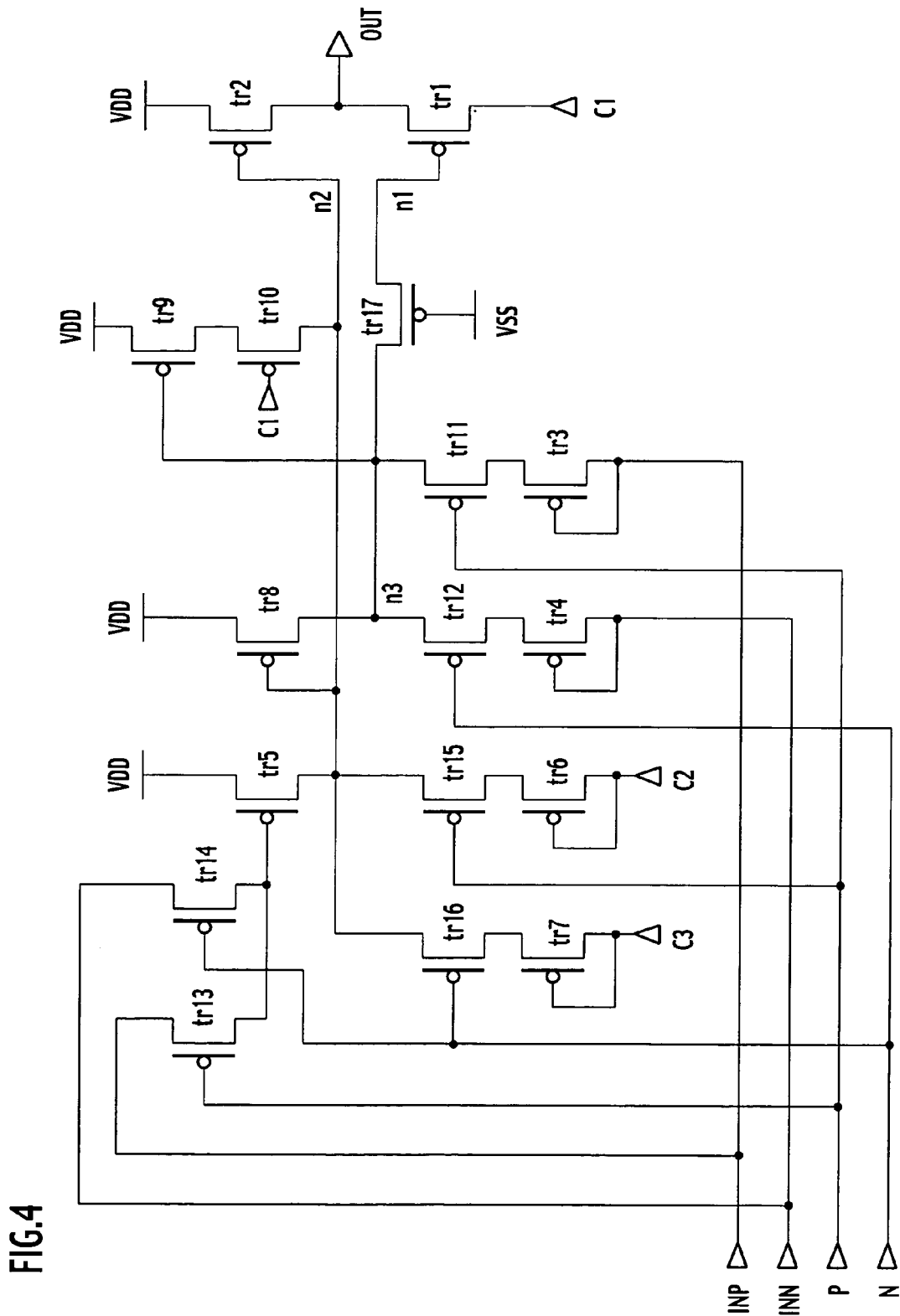
FIG. 4 shows one circuit diagram among a plurality of bidirectional shift registers included in the three-phase shift register of FIG. 3.

As shown in a circuit diagram of FIG. 4, the bidirectional shift register DSR includes an output circuit, an input circuit, a reset circuit and an inversion prevention circuit, all of which include a plurality of transistors. As an example, all of the transistors are assumed to be the PMOS transistors. Note that an expression "having a conductive path" which will be used in the following description means that two elements are electrically connected to each other regardless of whether the two elements are physically connected to each other.

The output circuit includes: a first transistor tr1 having a conductive path between the first clock terminal C1 and the output terminal OUT; and a second transistor tr2 having a conductive path between a power supply electrode, to which a power supply voltage VDD is supplied, and the output terminal OUT. A drain of the first transistor tr1 is electrically connected to the first clock terminal C1 and a source thereof is connected to the output terminal OUT. A source of the second transistor tr2 is connected to the power supply electrode and a drain thereof is connected to the output terminal OUT. The output circuit outputs a clock signal, which is inputted to the first clock terminal, to the output terminal OUT when the first transistor tr1 is on and the second transistor tr2 is off and outputs the power supply voltage VDD to the output terminal OUT when the first transistor tr1 is off and the second transistor tr2 is on.

The input circuit includes: a third transistor tr3 having a conductive path between the forward direction pulse input terminal INP and a control electrode of the first transistor tr1; a fourth transistor tr4 having a conductive path between the backward direction pulse input terminal INN and the control electrode of the first transistor tr1; and a fifth transistor tr5 having a conductive path between the power supply electrode, to which the power supply voltage VDD is supplied, and a control electrode of the second transistor tr2. The input circuit further includes: an eleventh transistor tr11 having a conductive path between the third transistor tr3 and the first transistor tr1; a twelfth transistor tr12 having a conductive path between the fourth transistor tr4 and the first transistor tr1; a thirteenth transistor tr13 having a conductive path between the forward direction pulse input terminal INP and the fifth transistor tr5; and a fourteenth transistor tr14 having a conductive path between the backward direction pulse input terminal INN and the fifth transistor tr5.

To be more specific, a drain and control electrode (gate) of the third transistor tr3 is connected to the forward direction pulse input terminal INP and a source of the third transistor tr3 is connected to a drain of the eleventh transistor tr11. The shift direction control signal P is inputted to a control electrode of the eleventh transistor tr11 and a source of the eleventh transistor tr11 is connected to the control electrode of the first transistor tr1 via a seventeenth transistor tr17. Moreover, a drain and control electrode of the fourth transistor tr4 is connected to the backward direction pulse input terminal INN and a source of the fourth transistor tr4 is connected to a drain of the twelfth transistor tr12. The shift direction control signal N is inputted to a control electrode of the twelfth transistor tr12 and a source of the twelfth transistor tr12 is connected to the control electrode of the first transistor tr1 via the seventeenth transistor tr17.

Note that the seventeenth transistor tr17 is turned off when a potential of a node n1 is lowered below a potential VSS by the clock signal inputted to the first clock terminal C1. Thus, a potential of a node n3 is prevented from falling below VSS. Consequently, an extra voltage equivalent to a potential difference between VDD and VSS or more is prevented from being applied between drain and source of an eighth transistor tr8, between gate and source of a ninth transistor tr9 and between gate and drain of the ninth transistor tr9, respectively.

Moreover, a source of the fifth transistor tr5 is connected to the power supply electrode, to which the power supply voltage VDD is supplied, and a drain of the fifth transistor tr5 is connected to the control electrode of the second transistor tr2. A source of the thirteenth transistor tr13 is connected to a control electrode of the fifth transistor tr5 and a drain of the thirteenth transistor tr13 is connected to the forward direction pulse input terminal INP. The shift direction control signal P is inputted to a control electrode of the thirteenth transistor tr13. A source of the fourteenth transistor tr14 is connected to the control electrode of the fifth transistor tr5 and a drain of the fourteenth transistor tr14 is connected to the backward direction pulse input terminal INN. The shift direction control signal N is inputted to a control electrode of the fourteenth transistor tr14.

In forward direction pulse shift, after receiving an input signal from the forward direction pulse input terminal INP, the input circuit makes the path between the third and first transistors tr3 and tr1 conductive by turning on the eleventh transistor tr11 and turning off the twelfth transistor tr12 according to the shift direction control signals P and N and makes the path between the forward direction pulse input terminal INP and the control electrode of the fifth transistor tr5 conductive by turning on the thirteenth transistor tr13 and turning off the fourteenth transistor tr14. Moreover, in backward direction pulse shift, after receiving an input signal from the backward direction pulse input terminal INN, the input circuit makes the path between the fourth and first transistors tr4 and tr1 conductive by turning on the twelfth transistor tr12 and turning off the eleventh transistor tr11 according to the shift direction control signals P and N and makes the path between the backward direction pulse input terminal INN and the control electrode of the fifth transistor tr5 conductive by turning on the fourteenth transistor tr14 and turning off the thirteenth transistor tr13.

In the input circuit of this embodiment, connections as described above are made between the third and eleventh transistors tr3 and tr11 and between the fourth and twelfth transistors tr4 and tr12, respectively. Thus, a potential of a sufficiently low level is supplied to the control electrode of the first transistor tr1 and the first transistor tr1 is surely turned on.

Specifically, when an input signal of a low level is inputted to the drain and control electrode of the third transistor tr3, a source potential of the third transistor tr3 becomes a potential higher than the low level of the input signal by a threshold voltage of the third transistor tr3. However, a potential is not increased by the eleventh transistor tr11 and a signal of a sufficiently low level is inputted to the control electrode of the first transistor tr1 to turn on the first transistor tr1. If the connection order of the third and eleventh transistors tr3 and tr11 is reversed, a potential transmitted to the control electrode of the first transistor tr1 becomes higher than a potential of the input signal of the low level by a threshold voltage of two transistors. Thus, an output level required to turn on the first transistor tr1 may not be obtained. The same applies to the connection order of the fourth and twelfth transistors tr4 and tr12.

The reset circuit includes: a sixth transistor tr6 having a conductive path between the second clock terminal C2 and the control electrode of the second transistor tr2; a seventh transistor tr7 having a conductive path between the third clock terminal C3 and the control electrode of the second transistor tr2; and the eighth transistor tr8 having a conductive path between the power supply electrode, to which the power supply voltage VDD is supplied, and the control electrode of the first transistor tr1. The reset circuit further includes: a fifteenth transistor tr15 having a conductive path between the sixth, second and eighth transistors tr6, tr2 and tr8; and a sixteenth transistor tr16 having a conductive path between the seventh, second and eighth transistors tr7, tr2 and tr8.

To be more specific, a drain and control electrode of the sixth transistor tr6 is connected to the second clock terminal C2 and a source of the sixth transistor tr6 is connected to a drain of the fifteenth transistor tr15. The shift direction control signal P is inputted to a control electrode of the fifteenth transistor tr15 and a source of the fifteenth transistor tr15 is connected to the control electrode of the second transistor tr2. A drain and control electrode of the seventh transistor tr7 is connected to the third clock terminal C3 and a source of the seventh transistor tr7 is connected to a drain of the sixteenth transistor tr16. The shift direction control signal N is inputted to a control electrode of the sixteenth transistor tr16 and a source of the sixteenth transistor tr16 is connected to the control electrode of the second transistor tr2. Moreover, the drain of the eighth transistor tr8 is connected to the control electrode of the first transistor tr1 via the seventeenth transistor tr17, a control electrode of the eighth transistor tr8 is connected to the control electrode of the second transistor tr2 and the source of the eighth transistor tr8 is connected to the power supply electrode.

The reset circuit turns on the second and eighth transistors tr2 and tr8 by setting a node n2 to a low level. When the eighth transistor tr8 is turned on, the node n1 becomes a high level and the first transistor tr1 is turned off. In the forward direction pulse shift, the fifteenth transistor tr15 is turned on and the sixteenth transistor tr16 is turned off according to the shift direction control signals P and N. Thus, the path between the sixth transistor tr6 and the control electrode of the second transistor tr2 are made conductive and the path between the sixth transistor tr6 and the control electrode of the eighth transistor tr8 are made conductive. In the backward direction pulse shift, the sixteenth transistor tr16 is turned on and the fifteenth transistor tr15 is turned off. Thus, the path between the seventh transistor tr7 and the control electrode of the second transistor tr2 are made conductive and the path between the seventh transistor tr7 and the control electrode of the eighth transistor tr8 are made conductive.

The inversion prevention circuit includes: the ninth transistor tr9 having a conductive path between the power supply electrode, to which the power supply voltage VDD is supplied, and the control electrode of the second transistor tr2 and a conductive path to the control electrode of the first transistor tr1; and a tenth transistor tr10 having a conductive path between the ninth and second transistors tr9 and tr2 and a conductive path to the first clock terminal C1.

To be more specific, a control electrode of the ninth transistor tr9 is connected to the control electrode of the first transistor tr1 via the seventeenth transistor tr17 and the source of the first transistor tr1 is connected to the power supply electrode. A control electrode of the tenth transistor tr10 is connected to the first clock terminal C1, a drain thereof is connected to the control electrode of the second transistor tr2 and a source thereof is connected to the drain of the ninth transistor tr9.

In a state where the first transistor tr1 is on and the second transistor tr2 is off, when a voltage level of a clock signal inputted to the first clock terminal C1 is inverted from a high level to a low level, a voltage level in the control electrode of the second transistor tr2 is inverted if the control electrode of the second transistor tr2 is in a floating state. Thus, the inversion prevention circuit prevents the inversion of the voltage level as described above. Here, the floating state means a state where no voltage of a high level is supplied to the control electrode and thus a potential of the control electrode is likely to fluctuate.

COMPARATIVE EXAMPLE

Next, description will be given of a configuration and operations of a three-phase shift register of a comparative example.

Figure 5:
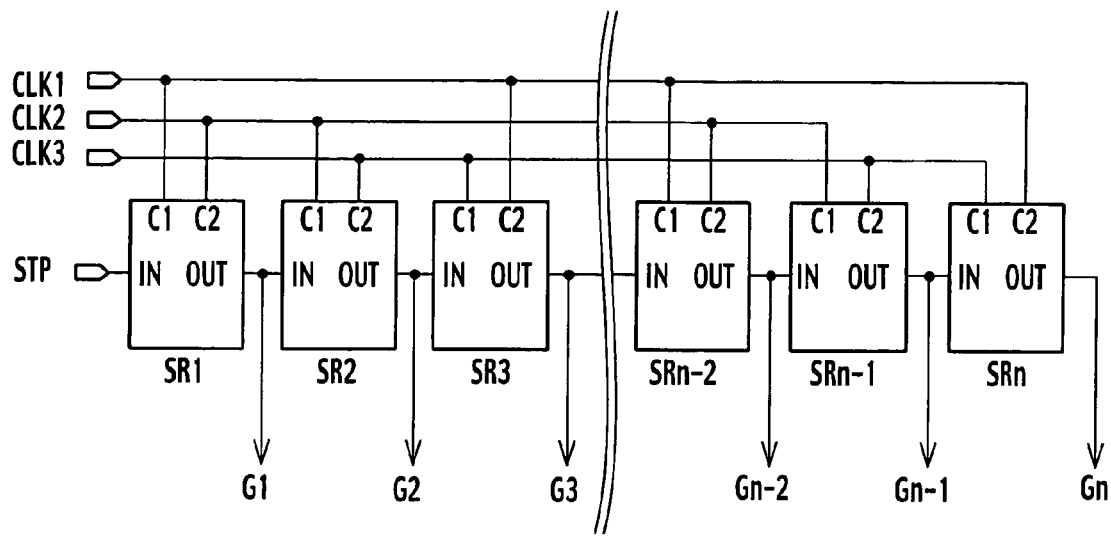
FIG. 5 shows a block diagram of a three-phase shift register of a comparative example, which shifts a pulse in a forward direction.

The three-phase shift register of the comparative example shown in FIG. 5 is used for at least one of the vertical shift register 4 and the horizontal shift register 6. Here, the description will be given of a case where the three-phase shift register of the comparative example is used for the vertical shift register 4.

This three-phase shift register includes: a plurality of shift registers SR1, SR2 ... SRn (hereinafter collectively referred to as "SR") which are electrically connected to each other in a row; a clock line that inputs any two of three clock signals CLK1 to CLK 3 having different phases from each other to the respective shift registers SR; and an output line that outputs output signals from the respective shift registers SR to the respective scan lines G.

The shift registers SR1, SR2 . . . SRn correspond to a first stage, a second stage . . . and an nth stage, respectively. Each shift register SR includes a first clock terminal C1 and a second clock terminal C2. For example, in the shift register SR1, the clock signal CLK1 is inputted to the first clock terminal C1 and the clock signal CLK2 is inputted to the second clock terminal C2. Moreover, a start pulse STP is inputted to the shift register SR1 as an input signal IN and, to each of the shift registers SR in the second to nth stages, an output signal OUT from the shift register in the preceding stage is inputted as the input signal IN.

Figure 6:
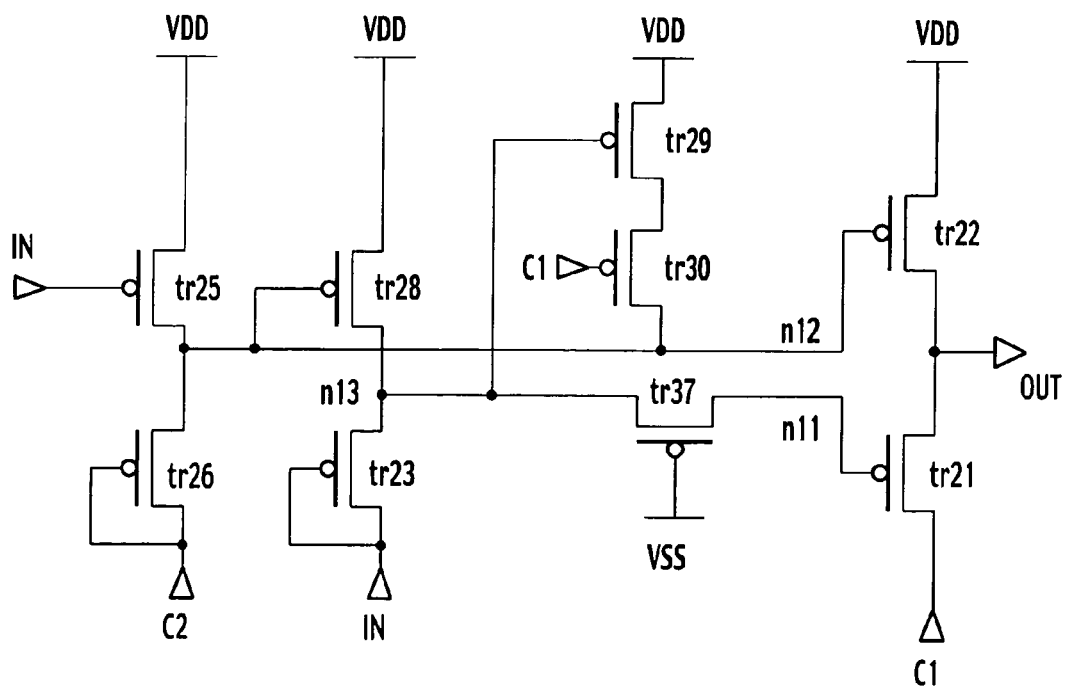
FIG. 6 shows one circuit diagram among a plurality of shift registers included in the three-phase shift register of the comparative example.

As shown in a circuit diagram of FIG. 6, each of the shift registers SR includes an output circuit, an input circuit, a reset circuit and an inversion prevention circuit, all of which include a plurality of transistors. As an example, all of the transistors are assumed to be the PMOS transistors.

The output circuit includes a twenty-first transistor tr21 and a twenty-second transistor tr22. The input circuit includes a twenty-third transistor tr23 and a twenty-fifth transistor tr25. The reset circuit includes a twenty-sixth transistor tr26 and a twenty-eighth transistor tr28. The inversion prevention circuit includes a twenty-ninth transistor tr29 and a thirtieth transistor tr30. Moreover, between the twenty-third and twenty-first transistors tr23 and tr21, a thirty-seventh transistor tr37 in its on state is connected. Here, it is assumed that a conductive path to a control electrode of the twenty-first transistor tr21 is a node n11, a conductive path to a control electrode of the twenty-second transistor tr22 is a node n12 and a conductive path to a source of the thirty-seventh transistor tr37 is a node n13.

Figure 7:
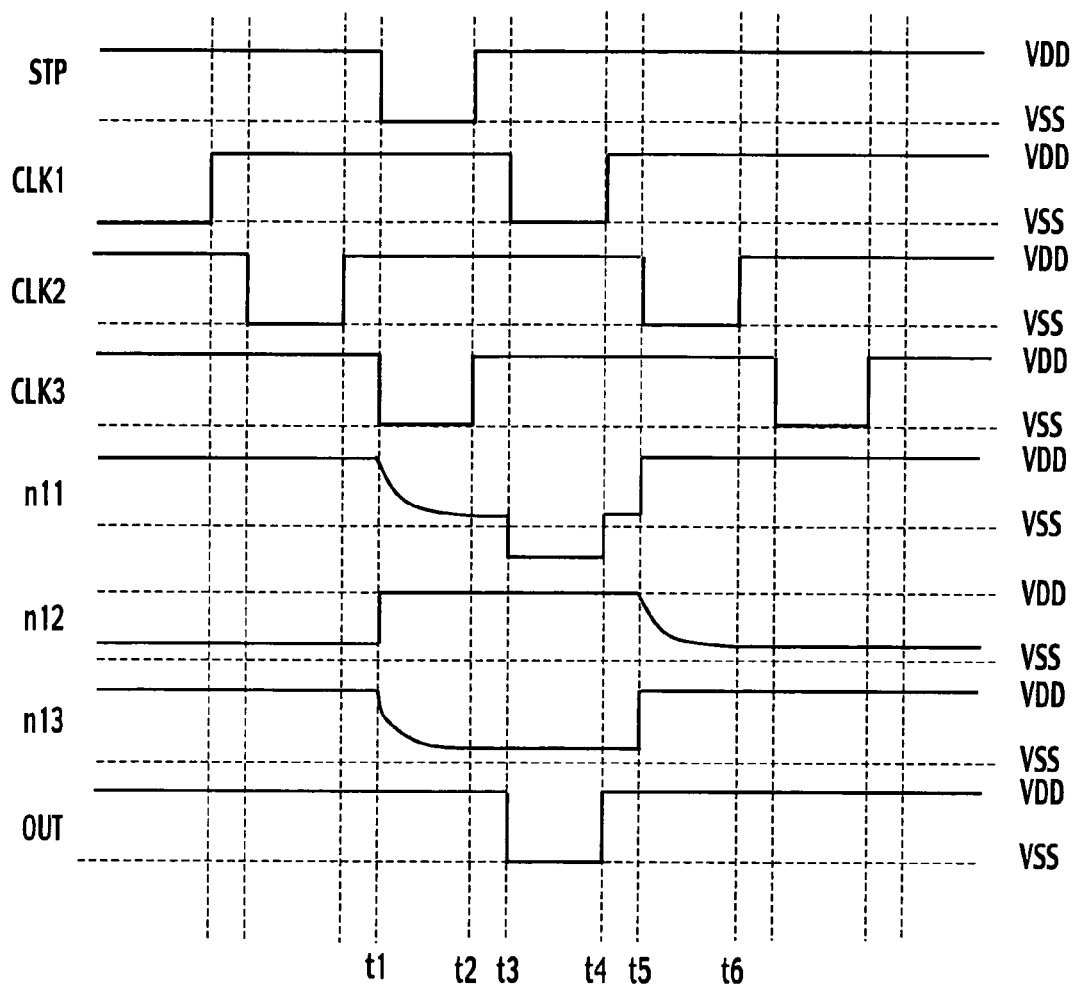
FIG. 7 shows a timing chart when the shift register of the comparative example shifts a pulse in the forward direction.

Next, with reference to the circuit diagram of FIG. 6 and a timing chart of FIG. 7, operations of each shift register SR will be described by taking the shift register SR1 as an example.

Before time t1, a potential of the start pulse STP inputted to the input terminal IN is a high level and thus the twenty-fifth transistor tr25 is in its off state. Consequently, a potential of the node n12 is a low level regardless of whether a potential of the clock signal CLK2 inputted to the second clock terminal C2 is of a high level or a low level and the twenty-eighth and twenty-second transistors tr28 and tr22 are in their on states.

Moreover, since the potential of the start pulse STP is of a high level, the twenty-third transistor tr23 is in its off state. In addition, since the twenty-eighth and thirty-seventh transistors tr28 and tr37 are in their on states, potentials of the nodes n13 and n11 are of high levels and the twenty-first transistor tr21 is in its off state.

As described above, the twenty-first transistor tr21 is in its off state and the twenty-second transistor tr22 is in its on state. Thus, the power supply voltage VDD is outputted as the output signal OUT through the twenty-second transistor tr22 regardless of whether a potential of the input signal CLK1 inputted to the first clock terminal C1 is of a high level or a low level.

In a period from time t1 to time t2, the potential of the start pulse STP becomes of a low level and the potentials of the clock signals CLK1 and CLK2 are maintained at a high level. Thus, the twenty-third and twenty-fifth transistors tr23 and tr25 are turned on. Since the potential of the node n12 reaches a high level through the twenty-fifth transistor tr25, the twenty-second and twenty-eighth transistors tr22 and tr28 are turned off. Moreover, since the potentials of the nodes n13 and n11 reach a low level through the twenty-third transistor tr23, the twenty-first transistor tr21 is turned on. In such a manner, since the twenty-first transistor tr21 is turned on and the twenty-second transistor tr22 is turned off, the high-level potential by the clock signal CLK1 inputted to the first clock terminal C1 is outputted as the output signal OUT through the twenty-first transistor tr21.

In a period from time t2 to time t3, the potential of the start pulse STP reaches a high level and the potentials of the clock signals CLK1 and CLK2 are maintained at a high level. Thus, the twenty-third and twenty-fifth transistors tr23 and tr25 are turned off. Consequently, the nodes n11 and n12 become the floating state. The node n11 maintains the low-level potential immediately before the floating state and the node n12 maintains the high-level potential. Accordingly, the twenty-first transistor tr21 maintains its on state and the twenty-second transistor tr22 maintains its off state. Moreover, the high-level potential by the clock signal CLK1 is outputted as the output signal OUT through the twenty-first transistor tr21.

In a period from time t3 to time t4, the potential of the clock signal CLK1 reaches the low level and the potentials of the start pulse STP and the clock signal CLK2 are maintained at a high level. A potential fluctuation of the clock signal CLK1 in this event is transmitted to the node n11 in its floating state and thus the potential of the node n11 is lowered to a much lower potential than VSS. Since the twenty-first transistor tr21 maintains its on state and the twenty-second transistor tr22 maintains its off state, the low-level potential by the clock signal CLK1 is outputted as the output signal through the twenty-first transistor tr21.

When the output signal OUT is inverted from the high level to the low level as described above, the node n12 having the high-level potential in its floating state is influenced by the inversion of the output signal OUT and inverted to the low level. Thus, there occurs a problem that the twenty-second transistor tr22 is turned on. In order to prevent the inversion of the node n12, the inversion prevention circuit turns on the twenty-ninth transistor tr29 when the potential of the node n11 is the low level and turns on the thirtieth transistor tr30 when the potential of the clock signal CLK1 is the low level. Thus, when the twenty-first transistor tr21 is in its on state and the potential of the clock signal CLK1 is inverted from the high level to the low level, the power supply voltage VDD is supplied to the node n12 through the twenty-ninth and thirtieth transistors tr29 and tr30 and the floating state of the node n12 is averted. Accordingly, the potential of the node n12 is prevented from being inverted.

In a period from time t4 to time t5, the potential of the clock signal CLK1 reaches a high level and the potentials of the start pulse STP and the clock signal CLK2 are maintained at a high level. The potential of the node n11 in its floating state is influenced by the potential fluctuation of the clock signal CLK1 and returned to the normal low level. Since the twenty-first transistor tr21 is still in its on state, the high-level potential of the clock signal CLK1 is outputted as the output signal OUT through the twenty-first transistor tr21.

In a period from time t5 to time t6, the potential of the clock signal CLK2 reaches a low level and the potentials of the start pulse STP and the clock signal CLK1 are maintained at a the high level. In this event, the twenty-sixth transistor tr26 is turned on and the potential of the node n12 becomes the potential of the clock signal CLK2, that is, of a low level. Since the potential of the node n12 reaches a low level, the twenty-eighth transistor tr28 is turned on and the potentials of the nodes n13 and n11 reach a high level.

After time t6, unless the potential of the start pulse STP reaches a low level, the node n11 maintains the high-level potential and the node n12 maintains low-level potential. Thus, since the twenty-first transistor tr21 maintains its off state and the twenty-second transistor tr22 maintains its on state, the power supply voltage VDD is outputted as the output signal OUT through the twenty-second transistor tr22. According to the above-described operations, the shift register SR1 outputs the output signal OUT of which phase is obtained by shifting the phase of the start pulse STP.

Figure 8:
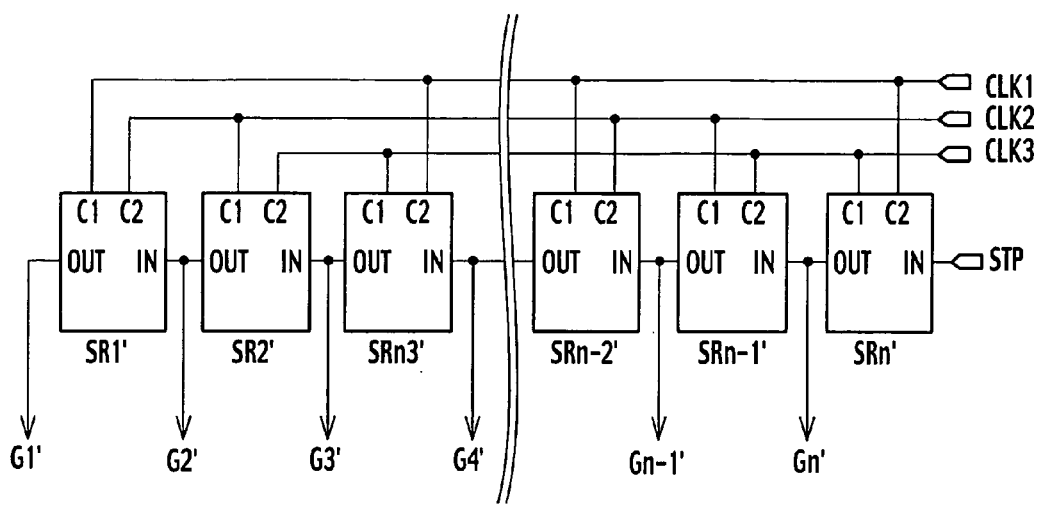
FIG. 8 shows a block diagram of the three-phase shift register of the comparative example, which shifts a pulse in a backward direction.

Subsequently, description will be given of a case where a direction of transmitting a pulse is reversed in the respective shift registers SR. A three-phase shift register shown in FIG. 8 transmits a start pulse STP from a shift register SRn' to SR1'. A basic configuration of the respective shift registers SR1', SR2' . . . SRn' is the same as that of the respective shift registers SR1, SR2 . . . SRn shown in FIG. 5. Moreover, the connection between the respective shift registers SR' and the connection wiring of the clock signals CLK1 to CLK 3 are also the same as those of the three-phase shift register shown in FIG. 5. When the shift register SRn' is taken as an example, the clock signal CLK3 is inputted to the first clock terminal C1 and the clock signal CLK1 is inputted to the second clock terminal C2.

In order to reverse the shift direction of the pulse in the three-phase shift register as described above, it is required to interchange waveforms between the clock signal CLK1 and the clock signal CLK3. In a timing chart of FIG. 9 when the shift register SRn' is taken as an example, the waveforms of the clock signals CLK1 and CLK3 are interchanged with each other compared to those of FIG. 7.

Figure 9:
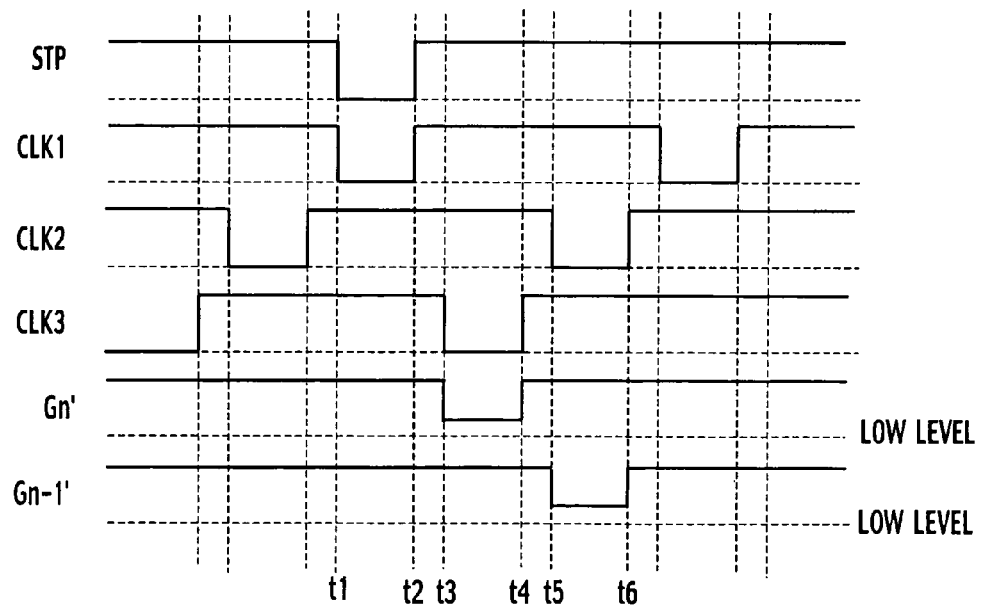
FIG. 9 shows a timing chart when the shift register of the comparative example shifts a pulse in the backward direction.

In a period from time t1 to time t2 of FIG. 9, both of the start pulse STP and the clock signal CLK1 are at low levels. The start pulse STP is inputted to the input terminal IN of the shift register SRn' and the clock signal CLK1 is inputted to the second clock terminal C2. Thus, the twenty-fifth and twenty-sixth transistors tr25 and tr26 are turned on at the same time and a current flows through between the both transistors (hereinafter this current will be referred to as a "through-current"). Because of this through-current, the potential of the node n12 is no longer sufficiently increased to the power supply voltage VDD. Thus, the twenty-eighth transistor tr28 does not reach its complete off state and the power supply voltage VDD is supplied to the node n11 through the twenty-eighth transistor tr28. Consequently, the potential of the node n11 is not sufficiently lowered to a low level.

In a period from time t3 to time t4, when the clock signal CLK3 inputted to the first clock terminal C1 reaches a low level, the potential of the node n11 is influenced by the lowered clock signal CLK3 and lowered. However, the potential of the node n11 does not reach a low enough level to turn on the twenty-first transistor tr21. Thus, since the potential of the node n12 is not sufficiently increased to a high level, the twenty-second transistor tr22 does not reach its complete off state. Moreover, since the potential of the node n11 is not lowered enough to turn on the twenty-first transistor tr21, the twenty-first transistor tr21 does not reach its complete on state. Thus, a potential of an output signal from the shift register SRn' in the scan line Gn' does not reach a complete low level but reaches a higher level than the potential of the output signal OUT in the forward direction drive shown in FIG. 7.

Such a variation in the potential level of the output signals between the forward direction and the backward direction in terms of the direction of transmitting the pulse leads to deterioration of display quality. Moreover, the through-current flowing in the backward direction drive becomes a factor that triggers an increase in power consumption.

EXAMPLE

A bidirectional shift register DSR of an example is one that solves the above-described problems in the shift register of the comparative example. By use of the circuit diagram of FIG. 4 and timing charts of FIGS. 10 and 11, operations of the bidirectional shift register of the example will be described below. Here, it is assumed that the conductive path to the control electrode of the first transistor tr1 is the node n1, the conductive path to the control electrode of the second transistor tr2 is the node n2 and the conductive path to the source of the seventeenth transistor tr17 is the node n3.

Note that the first transistor tr1, the second transistor tr2, the third transistor tr3, the fifth transistor tr5, the sixth transistor tr6, the eighth transistor tr8, the ninth transistor tr9 and the tenth transistor tr10 of the bidirectional shift register DSR correspond to the twenty-first transistor tr21, the twenty-second transistor tr22, the twenty-third transistor tr23, the twenty-fifth transistor tr25, the twenty-sixth transistor tr26, the twenty-eighth transistor tr28, the twenty-ninth transistor tr29 and the thirtieth transistor tr30 of the shift register SR, respectively.

In the bidirectional shift register DSR, the output circuit includes the first and second transistors tr1 and tr2. The input circuit includes the third to fifth transistors tr3 to tr5 and the eleventh to fourteenth transistors tr11 to tr14. The reset circuit includes the sixth to eighth transistors tr6 to tr8 and the fifteenth and sixteenth transistors tr15 and tr16. The inversion prevention circuit includes the ninth and tenth transistors tr9 and tr10.

A case of shifting a pulse in a forward direction will be described by taking the bidirectional shift register DSR1 as an example. The shift direction control signal P reaches a low-level potential and the shift direction control signal N reaches a high-level potential. Thus, the eleventh transistor tr11, the thirteenth transistor tr13 and the fifteenth transistor tr15 of the bidirectional shift register DSR1 are turned on and the twelfth transistor tr12, the fourteenth transistor tr14 and the sixteenth transistor tr16 are turned off.

Figure 10:
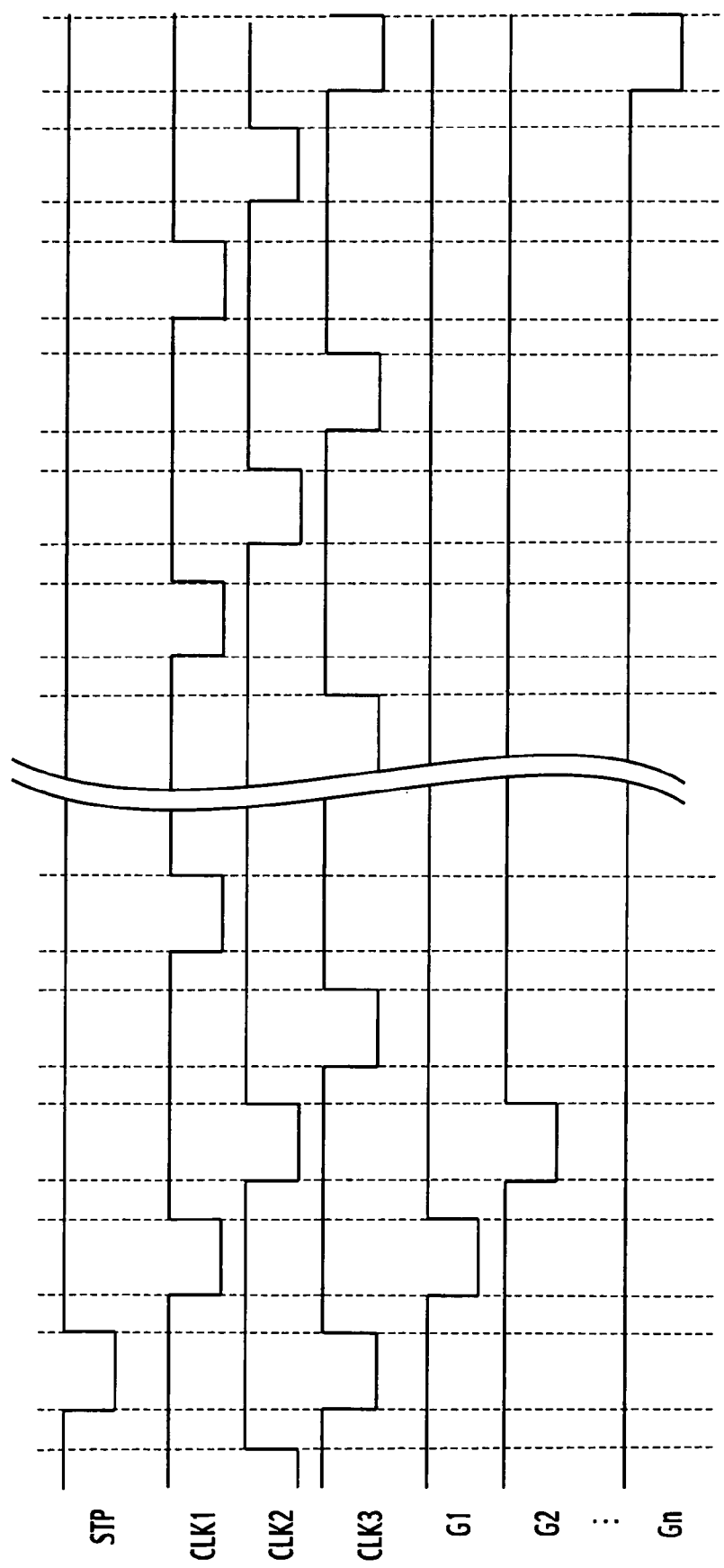
FIG. 10 shows a timing chart when a bidirectional shift register of an example shifts a pulse in a forward direction.

As shown in FIG. 10, a start pulse STP and a clock signal CLK3 both have a period in which respective potentials thereof reach a low level at the same time. The start pulse STP is supplied to the control electrode of the fifth transistor tr5 from the forward direction pulse input terminal INP via the thirteenth transistor tr13. Thus, the fifth transistor tr5 is turned on in this period. The clock signal CLK3 is inputted from the third clock terminal C3 and supplied to the control electrode of the seventh transistor tr7. Thus, the seventh transistor tr7 is turned on. In the shift register SR of the comparative example, when the twenty-fifth and twenty-sixth transistors tr25 and tr26 are both turned on, the through-current flows between the both transistors. On the contrary, in the bidirectional shift transistor DSR1, the sixteenth transistor tr16 disposed between the fifth transistor tr5 and the seventh transistor tr7 is in its off state. Thus, it is possible to prevent the through-current from flowing between the fifth transistor tr5 and the seventh transistor tr7.

Next, a case of shifting a pulse in a backward direction will be described by taking the bidirectional shift register DSRn as an example. The shift direction control signal P reaches a high-level potential and the shift direction control signal N reaches a low-level potential. Thus, the eleventh transistor tr11 and the thirteenth transistor tr13 of the input circuit and the fifteenth transistor tr15 of the reset circuit are turned off and the twelfth transistor tr12 and the fourteenth transistor tr14 of the input circuit and the sixteenth transistor tr16 of the reset circuit are turned on.

Figure 11:
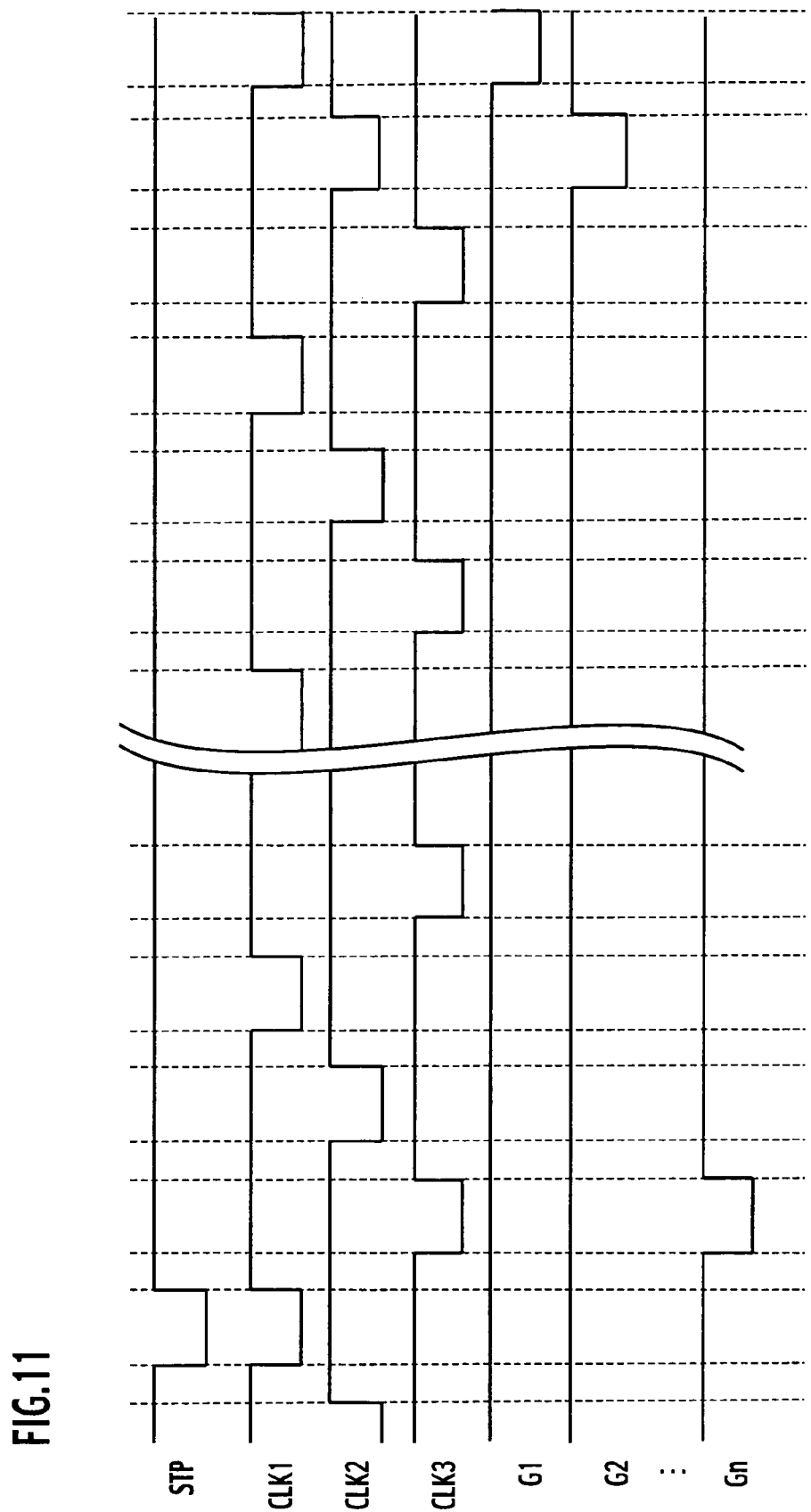
FIG. 11 shows a timing chart when the bidirectional shift register of the example shifts a pulse in a backward direction.

When waveforms of the clock signals CLK1 and CLK3 are interchanged with each other, as shown in FIG. 11, the start pulse STP and the clock signal CLK1 have a period in which the respective potentials thereof reach a low level at the same time. The start pulse STP is supplied to the control electrode of the fifth transistor tr5 from the backward direction pulse input terminal INN of the bidirectional shift register DSRn via the fourteenth transistor tr14. Thus, the fifth transistor tr5 is turned on in this period. The clock signal CLK1 is inputted from the second clock terminal C2 and supplied to the control electrode of the sixth transistor tr6. Thus, the sixth transistor tr6 is turned on. Although the fifth and sixth transistors tr5 and tr6 are both in the on state, the fifteenth transistor tr15 disposed between the fifth and sixth transistors tr5 and tr6 is in the off state. Thus, it is possible to prevent the through-current from flowing between the fifth and sixth transistors tr5 and tr6.

As described above, according to this embodiment, in the forward direction pulse shift, by turning on the fifteenth transistor tr15 of the reset circuit, the path between the sixth transistor tr6, the second transistor tr2 and the eighth transistor tr8 are made conductive. Subsequently, by turning off the sixteenth transistor tr16, the path between the fifth transistor tr5 and the seventh transistor tr7 are made non-conductive to prevent the through-current. Thus, the increase in power consumption is suppressed.

In the backward direction pulse shift, by turning on the sixteenth transistor tr16 of the reset circuit, the path between the seventh transistor tr7, the second transistor tr2 and the eighth transistor tr8 are made conductive. Subsequently, by turning off the fifteenth transistor tr15, the path between the fifth and sixth transistors tr5 and tr6 are made non-conductive to prevent the through-current. Thus, the increase in power consumption is suppressed.

Moreover, by preventing the through-current, the potential of the node n2 is sufficiently increased to the power supply voltage VDD and thus the eighth transistor tr8 and the second transistor tr2 reach a complete off state. The complete off state of the eighth transistor tr8 allows the low level of the input signal to be sufficiently transmitted to the node n1. Thus, the first transistor tr1 also reaches a complete on state. One of the first and second transistors tr1 and tr2 is completely turned off and the both transistors are not simultaneously turned on. Thus, the potential level of the output signal can be stabilized.

As described above, it is possible to prevent the variation in the potential level of the output signal of the bidirectional shift register DSR between the forward direction pulse shift and the backward direction pulse shift. Moreover, it is possible to provide a flat display device capable of high-quality display.

What is claimed is:

1. A bidirectional shift register comprising:
   an output circuit that includes a first transistor having a conductive path between a first clock terminal and an output terminal and a second transistor having a conductive path between a power supply electrode and the output terminal;
   an input circuit that includes a third transistor having a conductive path between a forward direction pulse input terminal and a control electrode of the first transistor, a fourth transistor having a conductive path between a backward direction pulse input terminal and the control electrode of the first transistor and a fifth transistor having a conductive path between the power supply electrode and a control electrode of the second transistor;
   a reset circuit that includes a sixth transistor having a conductive path between a second clock terminal and the control electrode of the second transistor, a seventh transistor having a conductive path between a third clock terminal and the control electrode of the second transistor and an eighth transistor having a conductive path between the power supply electrode and the control electrode of the first transistor, which makes the path between the sixth transistor, the control electrode of the second transistor and a control electrode of the eighth transistor conductive as well as making the path between the fifth transistor and the seventh transistor non-conductive in forward direction pulse shift and which makes the path between seventh transistor, the control electrode of the second transistor and the control electrode of the eighth transistor conductive as well as making the path between the fifth transistor and the sixth transistor non-conductive in backward direction pulse shift; and
   an inversion preventing circuit that prevents inversion of a voltage level in the control electrode of the second transistor when a voltage level of a clock signal inputted to the first clock terminal is inverted in a state where the first transistor is on and the second transistor is off.

2. The bidirectional shift register of claim 1, wherein the input circuit includes an eleventh transistor having a conductive path between the third transistor and the control electrode of the first transistor, a twelfth transistor having a conductive path between the fourth transistor and the first transistor, a thirteenth transistor having a conductive path between the forward direction pulse input terminal and the fifth transistor and a fourteenth transistor having a conductive path between the backward direction pulse input terminal and the fifth transistor, turns on the eleventh transistor and the thirteenth transistor as well as turning off the twelfth transistor and the fourteenth transistor in the forward direction pulse shift and turns off the eleventh transistor and the thirteenth transistor as well as turning on the twelfth transistor and the fourteenth transistor in the backward direction pulse shift.

3. The bidirectional shift register of claim 1, wherein the reset circuit includes a fifteenth transistor having a conductive path between the sixth transistor, the second transistor and the eighth transistor and a sixteenth transistor having a conductive path between the seventh transistor, the the second transistor and the eighth transistor, turns on the fifteenth transistor as well as turning off the sixteenth transistor in the forward direction pulse shift and turns off the fifteenth transistor as well as turning on the sixteenth transistor in the backward direction pulse shift.

4. The bidirectional shift register of claim 1, wherein the inversion prevention circuit includes a ninth transistor having a conductive path between the power supply electrode and the control electrode of the second transistor and a conductive path to the control electrode of the first transistor and a tenth transistor having a conductive path between the ninth transistor and the second transistor and a conductive path to the first clock terminal, supplies a power supply voltage to the control electrode of the second transistor by turning on both of the ninth and tenth transistors when a voltage level of a clock signal inputted to the first clock terminal is inverted in a state where the first transistor is on and the second transistor is off.

5. A drive circuit comprising:
a plurality of bidirectional shift registers which are connected to each other in such a manner that an output signal from an output terminal of each of the bidirectional shift registers is inputted to a backward direction pulse input terminal of the bidirectional shift register in a preceding stage as well as to a forward direction pulse input terminal of the bidirectional shift register in a subsequent stage, each bidirectional shift register including
an output circuit that includes a first transistor having a conductive path between a first clock terminal and an output terminal and a second transistor having a conductive path between a power supply electrode and the output terminal,
an input circuit that includes a third transistor having a conductive path between a forward direction pulse input terminal and a control electrode of the first transistor, a fourth transistor having a conductive path between a backward direction pulse input terminal and the control electrode of the first transistor and a fifth transistor having a conductive path between the power supply electrode and a control electrode of the second transistor,
a reset circuit that includes a sixth transistor having a conductive path between a second clock terminal and the control electrode of the second transistor, a seventh transistor having a conductive path between a third clock terminal and the control electrode of the second transistor and an eighth transistor having a conductive path between the power supply electrode and the control electrode of the first transistor, which makes the path between the sixth transistor, the control electrode of the second transistor and a control electrode of the eighth transistor conductive as well as making the path between the fifth transistor and the seventh transistor non-conductive in forward direction pulse shift and which makes the path between the seventh transistor, the control electrode of the second transistor and the control electrode of the eighth transistor conductive as well as making the path between the fifth transistor and the sixth transistor non-conductive in backward direction pulse shift and
an inversion prevention circuit that prevents inversion of a voltage level in the control electrode of the second transistor when a voltage level of a clock signal inputted to the first clock terminal is inverted in a state where the first transistor is on and the second transistor is off.

6. The drive circuit of claim 5, wherein the input circuit includes an eleventh transistor having a conductive path between the third transistor and the control electrode of the first transistor, a twelfth transistor having a conductive path between the fourth transistor and the first transistor, a thirteenth transistor having a conductive path between the forward direction pulse input terminal and the fifth transistor and a fourteenth transistor having a conductive path between the backward direction pulse input terminal and the fifth transistor, turns on the eleventh transistor and the thirteenth transistor as well as turning off the twelfth transistor and the fourteenth transistor in the forward direction pulse shift and turns off the eleventh transistor and the thirteenth transistor as well as turning on the twelfth transistor and the fourteenth transistor in the backward direction pulse shift.

7. The drive circuit of claim 5, wherein the reset circuit includes a fifteenth transistor having a conductive path between the sixth transistor, the second transistor and the eighth transistor and a sixteenth transistor having a conductive path between the seventh transistor, the second transistor and the eighth transistor, turns on the fifteenth transistor as well as turning off the sixteenth transistor in the forward direction pulse shift and turns off the fifteenth transistor as well as turning on the sixteenth transistor in the backward direction pulse shift.

8. The drive circuit of claim 5, wherein the inversion prevention circuit includes a ninth transistor having a conductive path between the power supply electrode and the control electrode of the second transistor and a conductive path to the control electrode of the first transistor and a tenth transistor having a conductive path between the ninth transistor and the second transistor and a conductive path to the first clock terminal, supplies a power supply voltage to the control electrode of the second transistor by turning on both of the ninth and tenth transistors when a voltage level of a clock signal inputted to the first clock terminal is inverted in a state where the first transistor is on and the second transistor is off.

9. A flat display device comprising:
a plurality of bidirectional shift registers in at least one of a scan line drive circuit and a signal line drive circuit, the bidirectional shift registers being connected to each other in such a manner that an output signal from an output terminal of each of the bidirectional shift registers is inputted to a backward direction pulse input terminal of the bidirectional shift register in a preceding stage as well as to a forward direction pulse input terminal of the bidirectional shift register in a subsequent stage and each bidirectional shift register including
an output circuit that includes a first transistor having a conductive path between a first clock terminal and an output terminal and a second transistor having a conductive path between a power supply electrode and the output terminal,
an input circuit that includes a third transistor having a conductive path between a forward direction pulse input terminal and a control electrode of the first transistor, a fourth transistor having a conductive path between a backward direction pulse input terminal and the control electrode of the first transistor and a fifth transistor having a conductive path between the power supply electrode and a control electrode of the second transistor,
a reset circuit that includes a sixth transistor having a conductive path between a second clock terminal and the control electrode of the second transistor, a seventh transistor having a conductive path between a third clock terminal and the control electrode of the second transistor and an eighth transistor having a conductive path between the power supply electrode and the control electrode of the first transistor, which makes the path between the sixth transistor, the control electrode of the second transistor and a control electrode of the eighth transistor conductive as well as making the path between the fifth transistor and the seventh transistor non-conductive in forward direction pulse shift and which makes the path between the seventh transistor, the control electrode of the second transistor and the control electrode of the eighth transistor conductive as well as making the path between the fifth transistor and the sixth transistor non-conductive in backward direction pulse shift and an inversion prevention circuit that prevents inversion of a voltage level in the control electrode of the second transistor when a voltage level of a clock signal inputted to the first clock terminal is inverted in a state where the first transistor is on and the second transistor is off;

an array substrate including the scan line drive circuit, the signal line drive circuit, switching elements and pixel electrodes provided in the respective switching elements, the switching elements being provided at respective intersections of a plurality of scan lines from the scan line drive circuit and a plurality of signal lines from the signal line drive circuit;

a counter substrate which is disposed opposite to the array substrate and has counter electrodes provided thereon, the counter electrodes electrically corresponding to the respective pixel electrodes; and a display layer held between the array substrate and the counter substrate.

10. The flat display device of claim 9, wherein the input circuit includes an eleventh transistor having a conductive path between the third transistor and the control electrode of the first transistor, a twelfth transistor having a conductive path between the fourth transistor and the first transistor, a thirteenth transistor having a conductive path between the forward direction pulse input terminal and the fifth transistor and a fourteenth transistor having a conductive path between the backward direction pulse input terminal and the fifth transistor, turns on the eleventh transistor and the thirteenth transistor as well as turning off the twelfth transistor and the fourteenth transistor in the forward direction pulse shift and turns off the eleventh transistor and the thirteenth transistor as well as turning on the twelfth transistor and the fourteenth transistor in the backward direction pulse shift.

11. The flat display device of claim 9, wherein the reset circuit includes a fifteenth transistor having a conductive path between the sixth transistor, the second transistor and the eighth transistor and a sixteenth transistor having a conductive path between the seventh transistor, the second transistor and the eighth transistor, turns on the fifteenth transistor as well as turning off the sixteenth transistor in the forward direction pulse shift and turns off the fifteenth transistor as well as turning on the sixteenth transistor in the backward direction pulse shift.

12. The flat display device of claim 9, wherein the inversion prevention circuit includes a ninth transistor having a conductive path between the power supply electrode and the control electrode of the second transistor and a conductive path to the control electrode of the first transistor and a tenth transistor having a conductive path between the ninth transistor and the second transistor and a conductive path to the first clock terminal, supplies a power supply voltage to the control electrode of the second transistor by turning on both of the ninth and tenth transistors when a voltage level of a clock signal inputted to the first clock terminal is inverted in a state where the first transistor is on and the second transistor is off.

* * * * *